United States Patent
Grand

(10) Patent No.: US 10,908,670 B2
(45) Date of Patent: Feb. 2, 2021

(54) AUDIO CIRCUIT AND METHOD FOR DETECTING SOUND ACTIVITY

(71) Applicant: Dolphin Integration, Meylan (FR)

(72) Inventor: Emmanuel Grand, Saint Pierre d'Allevard (FR)

(73) Assignee: Dolphin Integration, Meylan (FR)

( * ) Notice: Subject to any disclaimer, the term of this patent is extended or adjusted under 35 U.S.C. 154(b) by 124 days.

(21) Appl. No.: 16/337,300

(22) PCT Filed: Sep. 26, 2017

(86) PCT No.: PCT/FR2017/052581
§ 371 (c)(1),
(2) Date: Mar. 27, 2019

(87) PCT Pub. No.: WO2018/060584
PCT Pub. Date: Apr. 5, 2018

(65) Prior Publication Data
US 2019/0227614 A1    Jul. 25, 2019

(30) Foreign Application Priority Data

Sep. 29, 2016  (FR) ..................................... 16 59342

(51) Int. Cl.
*G10L 15/20*   (2006.01)
*G06F 1/3234*  (2019.01)
(Continued)

(52) U.S. Cl.
CPC ............ *G06F 1/325* (2013.01); *G06F 1/3206* (2013.01); *G06F 1/3287* (2013.01); *G10L 15/28* (2013.01);
(Continued)

(58) Field of Classification Search
None
See application file for complete search history.

(56) References Cited

U.S. PATENT DOCUMENTS

| | | | | |
|---|---|---|---|---|
| 5,103,481 A | * | 4/1992 | Iseda | G10L 25/78 704/219 |
| 5,201,028 A | * | 4/1993 | Theis | G10L 15/02 704/200 |

(Continued)

OTHER PUBLICATIONS

English Translation of the Written Opinion of the International Searching Authority issued in PCT application No. PCT/FR2017/052581, dated Mar. 1, 2018, 6 pp.

(Continued)

*Primary Examiner* — Richard Z Zhu
(74) *Attorney, Agent, or Firm* — Kaplan Breyer Schwarz, LLP

(57) ABSTRACT

A circuit for sound activity detection includes a transducer (106) adapted to generate an electrical signal based on detected sound; a variable gain amplifier adapted to amplify the electrical signal to generate an amplified electrical signal; a comparator adapted to compare the amplified electrical signal with at least one first threshold level to generate a comparison signal indicating comparator events; and a control circuit adapted to generate, based on the comparison signal, a gain control signal for controlling the gain of the variable gain amplifier, and a sound activity alert signal indicating the detection of sound activity.

13 Claims, 2 Drawing Sheets

(51) Int. Cl.
*G10L 25/78* (2013.01)
*G06F 1/3206* (2019.01)
*G06F 1/3287* (2019.01)
*H03G 3/30* (2006.01)
*H03G 3/34* (2006.01)
*G10L 15/28* (2013.01)
*G10L 25/93* (2013.01)
*G10L 25/87* (2013.01)

(52) U.S. Cl.
CPC ............... *G10L 25/78* (2013.01); *H03G 3/30* (2013.01); *H03G 3/3005* (2013.01); *H03G 3/342* (2013.01); *G10L 25/87* (2013.01); *G10L 25/93* (2013.01); *G10L 2025/786* (2013.01)

(56) References Cited

U.S. PATENT DOCUMENTS

| | | | | |
|---|---|---|---|---|
| 5,315,688 | A * | 5/1994 | Theis | G10L 15/02 704/233 |
| 5,548,680 | A * | 8/1996 | Cellario | G10L 19/012 704/219 |
| 5,666,384 | A | 9/1997 | Kuban et al. | |
| 5,867,574 | A * | 2/1999 | Eryilmaz | H04B 1/46 379/388.04 |
| 2003/0142812 | A1 * | 7/2003 | Allen | H04M 9/082 379/387.01 |
| 2004/0193406 | A1 * | 9/2004 | Yamato | G10L 25/78 704/207 |
| 2008/0278240 | A1 | 11/2008 | Sirito-Olivier et al. | |
| 2010/0323652 | A1 * | 12/2010 | Visser | H04R 3/005 455/232.1 |
| 2011/0257967 | A1 * | 10/2011 | Every | G10L 21/0232 704/226 |
| 2012/0123769 | A1 * | 5/2012 | Urata | H03G 3/3089 704/225 |
| 2013/0201272 | A1 * | 8/2013 | Enbom | H04N 7/15 348/14.01 |
| 2014/0233761 | A1 * | 8/2014 | Hu | G10L 21/034 381/107 |
| 2014/0337036 | A1 * | 11/2014 | Haiut | G10L 15/20 704/275 |
| 2015/0318833 | A1 * | 11/2015 | Nielsen | H04R 3/06 381/107 |
| 2016/0087596 | A1 * | 3/2016 | Yurrtas | H04R 1/04 381/111 |

OTHER PUBLICATIONS

Authorized Officer: Virette, David, International Search Report issued in PCT application No. PCT/FR2017/052581, dated Nov. 21, 2017, 3 pp.

* cited by examiner

AUDIO CIRCUIT AND METHOD FOR DETECTING SOUND ACTIVITY

The present patent application claims priority from the French patent application assigned filing number FR16/59342, the content of which is hereby incorporated by reference.

FIELD

The present disclosure relates to the field of audio devices using voice activity detection, and in particular to a circuit and method for reducing power consumption based on automatic voice activation.

BACKGROUND

By reducing the power consumption of portable electronic devices it is possible to increase the battery life. In the case of audio devices configured to capture and process a voice signal, one technique that has been proposed for reducing power consumption is to use voice activity detection, such that certain processing circuits are only activated when the voice signal is present. At other times, these processing circuits can be powered down, thereby economising energy.

In order to implement voice activity detection, it is generally necessary that the audio chain is active in order to pick up the sound from an environment, and detect the presence of voice. This audio chain generally includes a transducer, an amplifier, an analogue to digital converter (ADC) and additional data processing circuits for detecting voice. A drawback of such an approach is that this audio chain is itself relatively power consuming. Furthermore, current voice detection techniques based on the digitized audio signal tend to be relatively complex.

There is thus a need in the art for a simple circuit and method for voice activity detection that permits further reductions in power consumption.

SUMMARY

It is an aim of embodiments of the present description to at least partially address one or more needs in the prior art.

According to one aspect, there is provided a circuit for sound activity detection comprising: a transducer adapted to generate an electrical signal based on detected sound; a variable gain amplifier adapted to amplify the electrical signal to generate an amplified electrical signal; a comparator adapted to compare the amplified electrical signal with at least one first threshold level to generate a comparison signal indicating comparator events; and a control circuit adapted to generate, based on the comparison signal, a gain control signal for controlling the gain of the variable gain amplifier, and a sound activity alert signal indicating the detection of sound activity.

According to one embodiment, the control circuit is configured to generate the gain control signal in order to decrease the gain if the comparison signal indicates a comparator event having a duration greater than a first time duration.

According to one embodiment, the control circuit is configured to generate the gain control signal in order to decrease the gain in response to each comparator event indicated by the comparison signal.

According to one embodiment, the control circuit is adapted to assert the sound activity alert signal if the gain control signal remains below a second threshold for more than a second time duration.

According to one embodiment, the control circuit is configured to generate the second threshold based on an average value of the gain control signal.

According to one embodiment, the control circuit is configured to generate the gain control signal in order to increase the gain if the comparison signal indicates no comparator event during a third time duration.

According to one embodiment, the control circuit is configured to generate the gain control signal in order to bring the amplitude of the amplified electrical signal towards the first threshold level of the comparator.

According to a further aspect, there is provided an audio device comprising: the above circuit; an analog to digital converter configured to receive the electrical signal and generate a digital audio signal based on the electrical signal; and a power management circuit configured to selectively activate the analog to digital converter based on the sound activity alert signal.

According to one embodiment, the audio device further comprises a communications interface configured to transmit the digital audio signal to one or more further circuits, the power management circuit being further configured to activate or deactivate the communications interface and/or the one or more further circuits based on the sound activity alert signal.

According to one embodiment, the communications interface is configured to transmit the sound activity alert signal to the one or more further circuits.

According to one embodiment, the audio device further comprises: an audio amplifier configured to amplify the electrical signal and provide the amplified electrical signal to the analog to digital converter, the power management circuit being further configured to activate or deactivate the audio amplifier based on the sound activity alert signal.

According to one embodiment, the audio device further comprises: an audio processing circuit configured to process the digital audio signal, the power management circuit being further configured to activate or deactivate the audio processing circuit based on the sound activity alert signal.

According to a further aspect, there is provided a method of sound activity detection by an activity detection circuit, the method comprising: generating, by a transducer, an electrical signal based on detected sound; amplifying, by a variable gain amplifier, the electrical signal to generate an amplified electrical signal; comparing, by a comparator, the amplified electrical signal with at least one threshold level to generate a comparison signal indicating comparator events; and generating, by a control circuit based on the comparison signal, a gain control signal for controlling the gain of the variable gain amplifier, and an sound activity alert signal indicating the detection of sound activity.

According to one embodiment, generating the gain control signal comprises decreasing the gain if the comparison signal indicates a comparator event having a duration greater than a first time duration.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

The term "connected" is used herein to designate a direct electrical connection between circuit elements, whereas the term "coupled" is used herein to designate an electrical connection that may be direct, or may be via one or more intermediate components such as resistors, capacitors, transistors, etc.

Figure 1:
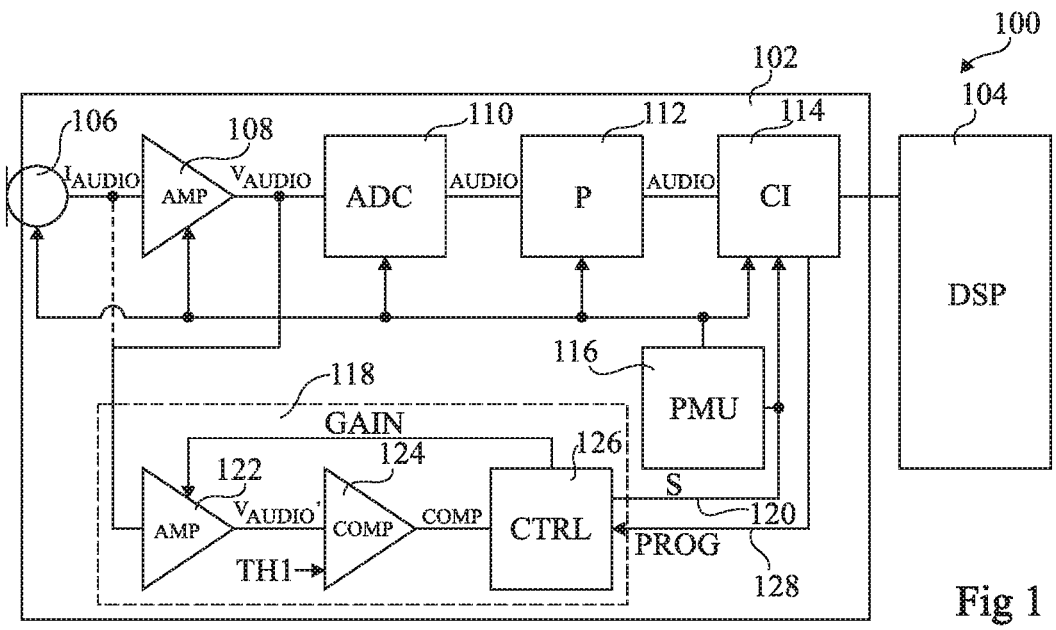
FIG. 1 schematically illustrates part of an electronics device comprising an audio circuit according to an example embodiment of the present disclosure.

FIG. 1 schematically illustrates part of an electronics device 100 comprising an audio circuit 102, and a digital signal processor (DSP) 104 that receives a digitized audio stream from the audio circuit 102. The DSP 104 for example processes the audio stream, applies audio encoding, etc.

The audio circuit 102 for example comprises an audio chain comprising at least one transducer 106, which is for example a MEMS (micro electro-mechanical system). The transducer 106 for example generates an electrical signal $I_{AUDIO}$ at its output based on detected sound, the electrical signal for example being a current signal, although in alternative embodiments the transducer 106 could comprise an impedance adaptation stage at its output, such that its output signal is a voltage signal. The output of the transducer 106 is for example coupled to an amplifier (AMP) 108. In the case that the output signal of the transducer 106 is a current signal $I_{AUDIO}$, the amplifier 108 is for example a charge amplifier adapted to convert the capacitive charge generated in the MEMS into a voltage signal $V_{AUDIO}$. Alternatively, the amplifier 108 amplifies a voltage signal provided by the transducer 106. The amplified signal $V_{AUDIO}$ at the output of the amplifier 108 is for example provided to an analog to digital converter (ADC) 110, implemented for example by a delta-sigma modulator. A digital audio signal AUDIO from the ADC 110 is for example provided to a processing circuit (P) 112 of the audio chain, which for example decimates the signal in order to simplify subsequent processing. Additionally or alternatively, the processing circuit (P) may perform other operations on the digital audio signal. A communications interface (CI) 114 for example receives the audio stream from the processing unit 112, and transmits it to one or more further circuits, such as the DSP 104, using a suitable communications protocol.

A power management unit (PMU) 116 for example selectively activates the circuits of the audio chain in order to manage power consumption. For example, the PMU 116 transmits a control signal to each component 106, 108, 110, 112 and 114 of the audio chain for controlling when each component is coupled to a supply voltage. In some embodiments, the PMU 116 may deactivate the circuits of the audio chain when the audio circuit 102 is in a sleep mode. Furthermore, in one or more modes of operation, the PMU 116 for example selectively activates at least part of the audio chain based on activity detection, as detected by an activity detection circuit 118.

The activity detection circuit 118 for example detects the presence of sounds in the environment of the audio circuit that could correspond to a voice command or the like. As described in more detail below, the activity detection circuit 118 for example generates, on an output line 120, an activity alert signal S indicating when activity is detected. In some embodiments, activity is detected when the amplitude of the detected sound level increases above an average level for more than a minimum duration.

The activity detection circuit 118 for example receives the analog signal $V_{AUDIO}$ at the output of the amplifier 108. In alternative embodiments, as represented by a dashed line in FIG. 1, the activity detection circuit 118 could receive the current or voltage signal at the output of the transducer 106. The activity detection circuit 118 for example comprises a variable gain amplifier (AMP) 122 receiving the analog signal $I_{AUDIO}$ or $V_{AUDIO}$ and configured to generate an amplified voltage signal $V_{AUDIO}'$. The activity detection circuit 118 further comprises a comparator (COMP) 124 adapted to compare the amplified signal from the amplifier 122 with at least one threshold TH1 and to generate a comparison signal COMP based on the comparison. The comparison signal COMP for example indicates comparator events triggered when the signal $V_{AUDIO}'$ exceeds the threshold level TH1. These comparator events for example have a duration ending when the signal $V_{AUDIO}'$ falls back below the threshold level TH1. The circuit 118 also for example comprises a control circuit (CTRL) 126 configured to generate, based on the comparison signal COMP, the activity alert signal S and a gain control signal GAIN for controlling the gain of the variable gain amplifier 122. The signal GAIN is for example a digital signal, although in alternative embodiments it could be an analog level. The control circuit 126 is for example implemented in hardware.

For example, the control circuit 126 is configured to adjust the gain of the variable gain amplifier 122 to bring the amplitude of the signal $V_{AUDIO}'$ at the input of the comparator 124 towards the threshold level TH1. In this way, the input voltage of the comparator is controlled to remain within the operating range of the comparator. Furthermore, an increase in the audio signal will cause the output signal COMP of the comparator to be asserted. In some embodiments, the control circuit 126 is configured to assert the activity alert signal S when the gain control signal GAIN has remained below a further threshold level for more than a minimum time duration D2. For example, the further threshold level is a variable level, and the control circuit 126 is configured to generate the further threshold level based on an average value of the gain control signal GAIN.

The control circuit 126 is also for example configured to process programming signal PROG on lines 128 described in more detail below.

Operation of the control circuit 126 will now be described in more detail with reference to FIG. 2.

Figure 2:
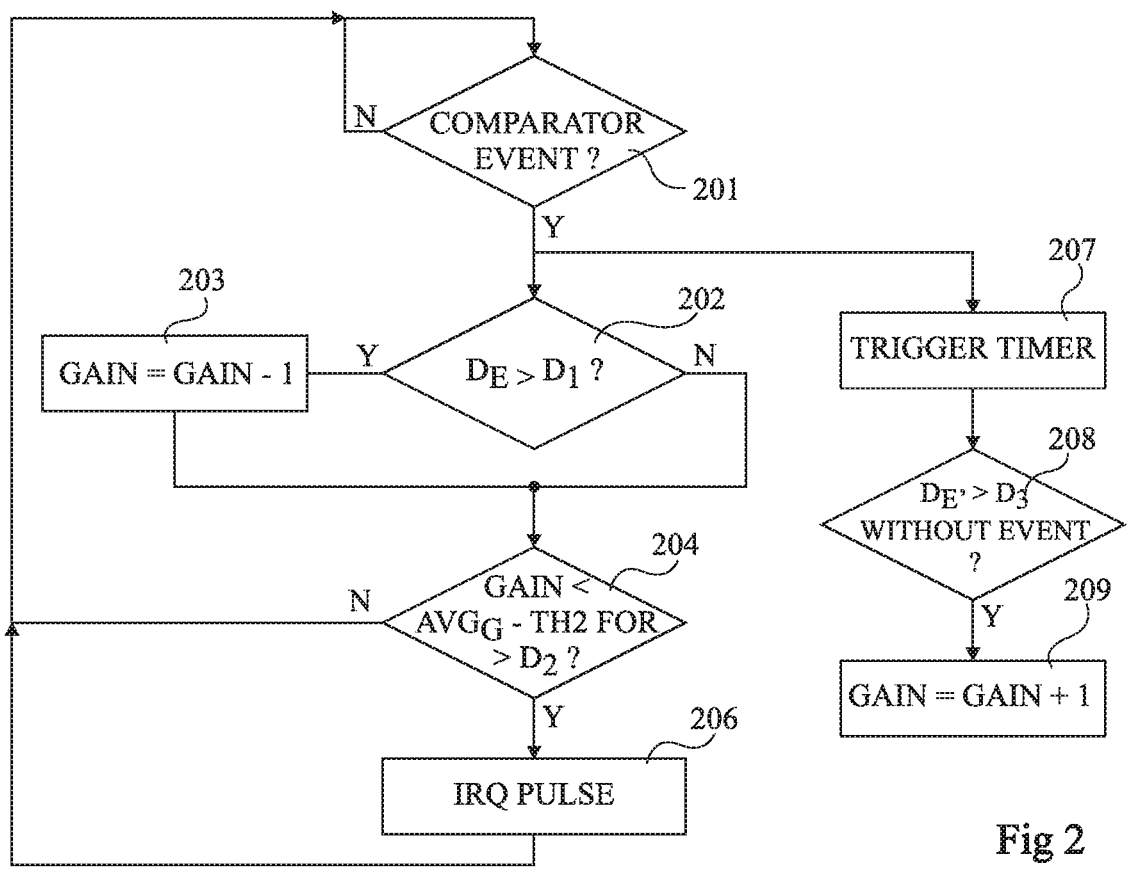
FIG. 2 is a flow diagram representing operations of a voice detection circuit of the audio circuit of FIG. 1 according to an example embodiment of the present disclosure.

FIG. 2 is a flow diagram illustrating operations in a method of generating the gain control signal GAIN and activity alert signal S according to an example embodiment. These operations are for example performed by the control circuit 126, which is for example implemented entirely in hardware, or at least partially in software executed by a suitable processor.

In an operation 201, it is determined whether a comparator event is detected. If so, the method goes to an operation 202.

In operation 202, the time duration $D_E$ of the event is compared to a minimum duration $D_1$. If the duration $D_E$ is higher than the minimum duration $D_1$, in an operation 203, the gain control signal GAIN is for example decremented by 1, or otherwise reduced, and the next operation is an operation 204. Alternatively, if the duration $D_E$ is lower than the minimum duration $D_1$, the next operation after operation 202 is the operation 204. The duration $D_1$ is for example of between 0 and 100 μs. A value of 0 implies that the gain is reduced on every event, irrespective of the duration of the event. By providing a positive value of $D_1$, events that are too rapid can for example be discriminated.

In operation 204, the gain control signal GAIN is compared to a further threshold $AVG_G$-TH2 where TH2 is for example a fixed value, and $AVG_G$ is for example the average value of the gain control signal GAIN during a preceding period of for example between 100 ms and 1 s. In other words, the difference between the gain control signal GAIN and the average value $AVG_G$ is compared to the threshold TH2. If the gain control signal GAIN is not below the threshold $AVG_G$-TH2 or has not been below the threshold for a duration of at least $D_2$, the method for example returns to operation 201 ready for a subsequent comparator event to be detected. Alternatively, if the gain control signal GAIN has been below the threshold $AVG_G$-TH2 for at least the duration $D_2$, the next operation is 206. The duration $D_2$ is for example in the range 0 and 100 ms. The gain is for example a value in decibels, and the threshold TH2 is for example equal to between 0 and 16 dB. If the threshold TH2 and the duration $D_2$ are both close to zero, then any fall in the gain value below the average gain value will result in an activity detection.

In some embodiments, the average value $AVG_G$ of the gain control signal GAIN is generated by applying a low pass filter to this signal, the low pass filter having a cut-off frequency of between 10 and 100 Hz.

In operation 206, the activity alert signal S is for example asserted. In some embodiments, the alert signal S is an interrupt signal, and the alert activation is for example in the form of an IRQ (interrupt request) pulse transmitted to the communications interface 114.

After operation 206, the method for example returns to operation 201 until a subsequent comparator event occurs.

In some embodiments, the detection in operation 201 of a comparator event for example also triggers a series of operations 207 to 209 permitting the gain to be incremented.

Operation 207 for example comprises triggering a timer in response to the detection of the comparator event. In operation 208, it is for example determined whether the duration $D_E'$ elapsed since the comparator event has exceeded a duration $D_3$ without the occurrence of any new comparator event. If so, in an operation 209, the gain is for example incremented by 1 or otherwise increased. Alternatively, if there was an event before the end of the duration $D_3$, nothing happens. The duration $D_3$ is for example between 1 and 20 ms, and is for example greater than the duration $D_1$. In some embodiments, $D_3$ is smaller than the time constant of the low pass filter implemented in the control circuit 126 for generating the average gain value $AVG_G$.

In one embodiment, in addition to or rather than being triggered by a modification of the gain control signal, the operation 204 could be performed periodically, or could be triggered by the expiration of the duration $D_2$.

Figure 3A:
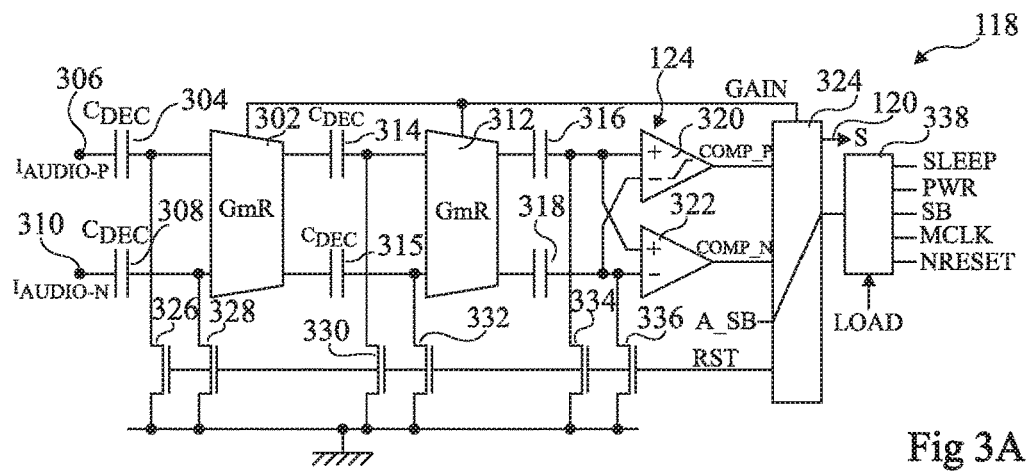
FIG. 3A schematically illustrates the voice detection circuit of FIG. 1 in more detail according to an example embodiment of the present disclosure.

FIG. 3A schematically illustrates the activity detection circuit 118 of FIG. 1 in more detail according to an example embodiment.

The variable gain amplifier 122 for example comprises an amplifier chain formed of n amplifier cells coupled in series, where n is for example equal to one or more, and for example two. In the example of FIG. 3A, there are two amplifier cells, each comprising a GmR circuit. A first of the amplifier cells comprises a GmR circuit 302 having differential inputs, one of the inputs being coupled via a decoupling capacitor 304 to an input 306, and the other of the inputs being coupled via a decoupling capacitor 308 to an input 310. The inputs 306, 310 for example respectively receive differential components $I_{AUDIO-P}$, $I_{AUDIO-N}$ of the analog electrical signal $I_{AUDIO}$. The GmR circuit 302 comprises differential outputs, one output being coupled to one differential input of the second GmR circuit 312 via a decoupling capacitor 314, and the other output being coupled to the other differential input of the second GmR circuit 312 via a decoupling capacitor 315.

The GmR circuit 312 for example comprises differential outputs, one of which is coupled via a decoupling capacitor 316 to one input of the comparator 124, and the other of which is coupled via a decoupling capacitor 318 to the other input of the comparator 124.

The comparator 124 for example comprises comparators 320, 322 each having a positive input coupled to the capacitor 316, and a negative input coupled to the capacitor 318. The outputs of the comparators 320, 322 for example respectively provide the differential components COMP-P and COMP-N of the comparison signal COMP and are for example coupled to inputs of a signal processor 324.

The inputs of the GmR circuit 302 are for example respectively coupled via transistors 326, 328, to a reset voltage level, which is for example at the ground level. Similarly, the inputs of the GmR circuit 312 are for example respectively coupled via transistors 330, 332, to the reset voltage level, and the positive and negative inputs of the comparator 124 are for example respectively coupled via transistors 334, 336, to the reset voltage level. The transistors 326 to 336 are for example controlled by a reset signal RST generated by the circuit 324, such that when the reset signal RST is asserted, the voltages of the capacitors 304, 308, 314, 315, 316 and 318 are for example reset to the reset voltage level.

The circuit 324 also for example generates the gain control signal GAIN provided to the GmR circuits 302, 312 and the activity alert signal S on the line 120. The control circuit 126 for example further comprises a register 338 storing programming signals SLEEP, PWR, SB, MCLK and NRESET, which are for example received from the DSP 104 via the interface 114 of FIG. 1, and correspond to the lines 128 of FIG. 1.

The signal SLEEP for example allows the circuit 118 to be placed in a paused mode, in which the clock is for example stopped such that the signals GAIN and $AVG_G$ are for example conserved. The circuit for example continues its operation when the sleep mode signal is deactivated.

The signal PWR is for example a power ratio signal defining the threshold TH2.

The signal SB is for example a signal allowing the circuit 118 to be placed in a standby mode. In this mode, the internal clocks of the circuit 324 are for example switched off. The circuit 324 for example generates a signal A_SB, which is an analog version of SB, and is used to switch-off currents in the GmR circuits 302, 312 and in the comparators 320, 322.

The signal MCLK is for example a master clock signal for the digital portions of the circuit 118, and this signal is for example used to generate the various delay signals D1, D2 and D3, and the time constant used for the calculation of the average gain value $AVG_G$. While not illustrated in FIG. 3A, in some embodiments the register 338 also receives and stores control signals C_AVG, C_D1, C_D2 and C_D3, which for example define the durations of the time constant and delays D1 to D3 respectively and permit the DSP 104 of FIG. 1 to control these durations.

The signal NRESET is for example a reset signal allowing registers (not illustrated in FIG. 3A) storing the gain control signal GAIN and average gain signal $AVG_G$ to be reset.

The register 338 is for example controlled by a data load signal LOAD, which causes the programming signals to be loaded into the register 338 and applied to the rest of the circuit 118.

Each of the GmR circuits 302, 312 for example has a gain that is variable in the range −3 dB to 20 dB. Assuming an embodiment comprising four GmR circuits, the overall gain is thus for example variable in the range −12 dB to 80 dB.

Figure 3B:
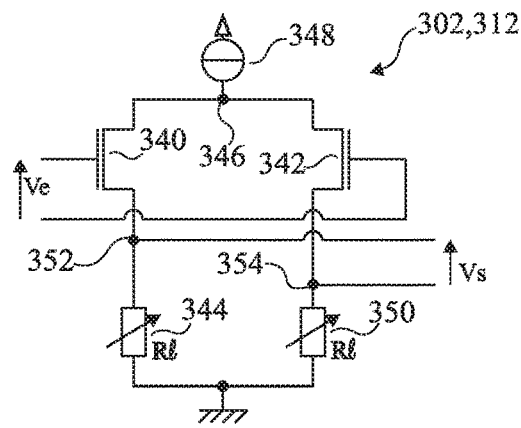
FIG. 3B schematically illustrates an amplifier of FIG. 3A in more detail according to an example embodiment.

FIG. 3B schematically illustrates an example implementation of the GmR circuit 302 and 312 in more detail according to an example embodiment. The circuit for example comprises transistors 340 and 342 forming a differential pair, having their sources coupled to a node 346, and receiving between their gates an input voltage $V_e$ of the GmR circuit. The drain of transistor 340 is for example coupled to ground via a variable resistor 344, and the drain of transistor 342 is for example coupled to ground via a variable resistor 350. Each of the variable resistors 344, 350 for example has a resistance of Rl. The node 346 is for example coupled to a supply voltage rail via a current source 348. The drains 352, 354 of the transistors 340, 342 for example provide the output voltage $V_s$ of the GmR circuit.

The transfer function of each GmR circuit 302, 312 is for example as follows:

$$H(s) = \frac{-gmC_{DEC}Rl}{C_{DEC}+C_G} \cdot \frac{1}{1+\frac{C_GC_{DEC}Rl}{C_{DEC}+C_G}\cdot s}$$

where gm is the transconductance of the transistors 340, 342, $C_{DEC}$ is the capacitance of the capacitors 304, 308, $C_G$ is the gate capacitance of transistors 340, 342, and Rl is the resistance of the variable resistors 344, 350.

The gain control signal GAIN for example varies the gain of the GmR circuits 302, 312, by varying the resistance of the variable resistors 344, 350, for example in a digital fashion. The maximum gain $G_{MAX}$ is for example set based on the minimal input signal that is capable of triggering the comparator 124.

Operation of the circuit 118 will now be described in more detail with reference to FIGS. 4A and 4B.

Figure 4A:
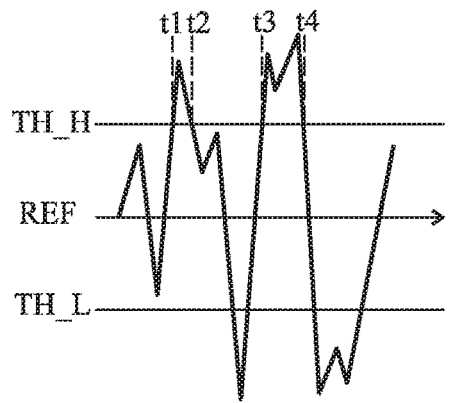
FIG. 4A is a graph representing the voltage at the input of a comparator of the voice detection circuit of FIG. 3A according to an example embodiment.

FIG. 4A illustrates the input signal of the comparator 124 according to an example in which the gain of the amplifier remains constant.

Figure 4B:
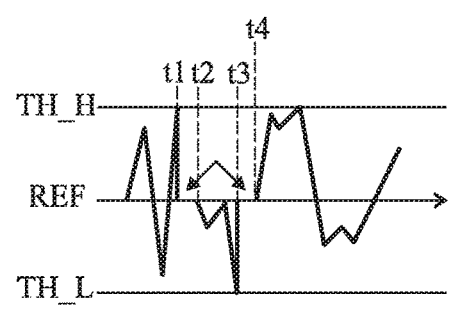
FIG. 4B is a graph representing the voltage at the input of a comparator of the voice detection circuit of FIG. 3A according to a further example embodiment.

FIG. 4B illustrates the input signal of the comparator 124 according to an example in which gain and offset modification is applied by the processing circuit 324.

In FIGS. 4A and 4B, the threshold TH_H is the threshold of the comparator 320, and the threshold TH_L is the threshold of the comparator 322. Each time the input signal passes one of these thresholds, the processing circuit 324 for example cancels the offset, and modifies the gain. Thus as represented in FIGS. 4A and 4B, at a time t1 when the upper threshold TH_H is exceeded, offset cancelation is performed by asserting the reset signal RST of FIG. 3A, and the gain is reduced by a constant step. At time t2, the signal starts again from the reference level, which is for example ground. There is for example a time gap between t1 and t2 during which the capacitors 304, 308, 314, 315, 316 and 318 are reset. At a time t3, the low threshold TH_L is passed, and again the offset is removed, bringing the signal back to the reference level, and the gain is reduced by a constant step. The signal starts again from the reference level REF at the time t4. Again, there is for example a time gap between t3 and t4 during which the capacitors 304, 308, 314, 315, 316 and 318 are reset.

The use of two comparators 320, 322 to form the comparator 124 has the advantage of limiting the range of the signal applied to the comparator. The thresholds TH_H and TH_L of the comparators 320, 322 are for example of opposite sign, and can be relatively close in value, or even identical.

Figure 5:
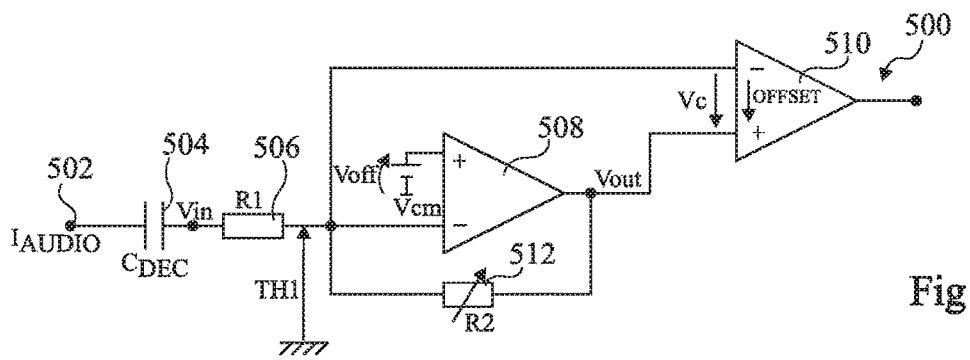
FIG. 5 schematically illustrates a variable gain amplifier and comparator of the voice detection circuit according to a further example embodiment.

FIG. 5 schematically illustrates a circuit 500 implementing the variable gain amplifier 122 and the comparator 124 of FIG. 1 according to an alternative embodiment to that of FIGS. 3A and 3B. In the example of FIG. 5 the electrical signal $I_{AUDIO}$ is a single-ended signal.

An input node 502 receiving the analog electrical signal $I_{AUDIO}$ is for example coupled via the series connection of a decoupling capacitor 504 and a resistor 506, which is for example a fixed or variable resistor, to the negative input of a differential amplifier 508 and to the negative input of a differential amplifier 510. The positive input of the differential amplifier 508 is coupled to a voltage level Vcm+Voff, where Vcm is a reference voltage, and Voff is an offset voltage of the differential amplifier 508. The output of the differential amplifier 508 is coupled to the positive input of the differential amplifier 510, and to the negative input of the amplifier 508 via a feedback path comprising a variable resistor 512.

The variable gain amplifier 122 is implemented by the differential amplifier 508 and the resistors 506 and 512, which respectively have resistances R1 and R2. Calling Vin the input voltage at the input of the variable gain amplifier and Vout the output voltage at the output of the differential amplifier 508, the output voltage for example has the following equation: Vout=−Vin*R2/R1. The gain control signal GAIN for example controls the resistance R2 in order to vary the gain of the amplifier.

The negative input of the differential amplifier 508 for example provides a virtual ground at the threshold voltage level TH1, and is connected to the negative input of the differential amplifier 510. The voltage Vc across the inputs of the comparator 510 is thus equal to:

Vc=(Vcm+Voff−Vin·R2/R1)−(Vcm+Voff)=Vin·R2/R1

Thus the offset voltage Voff of the differential amplifier 508 does not impact the result.

An advantage of the embodiments described herein is that activity detection can be performed on an electrical signal supplied by a transducer in a simple and effective fashion. Indeed, an advantage of using a variable gain amplifier and controlling the gain based on the time duration between comparator events is that the input signal of the comparator can remain within its operating range. Furthermore, by basing the activity detection on the gain control signal, periods during which the input audio signal is increasing can be identified, giving a reliable indication of activity.

Having thus described at least one illustrative embodiment, various alterations, modifications and improvements will readily occur to those skilled in the art. For example, it will be apparent to those skilled in the art that the implementations illustrated in FIGS. 3A and 5 are merely examples, and that various alternative implementations of the variable gain amplifier and the comparator would be possible.

The invention claimed is:

1. A circuit for sound activity detection comprising:
   a transducer adapted to generate an electrical signal based on detected sound;
   a variable gain amplifier adapted to amplify the electrical signal to generate an amplified electrical signal;
   a comparator adapted to compare the amplified electrical signal with at least one first threshold level to generate a comparison signal indicating comparator events; and
   a control circuit adapted to generate, based on the comparison signal, a gain control signal for controlling the gain of the variable gain amplifier, and a sound activity alert signal indicating the detection of sound activity, wherein the control circuit is adapted to assert the sound activity alert signal if the gain control signal remains below a second threshold for more than a second time duration.

2. The circuit of claim 1, wherein the control circuit is configured to generate the gain control signal in order to decrease the gain if the comparison signal indicates a comparator event having a duration greater than a first time duration.

3. The circuit of claim 2, wherein the control circuit is configured to generate the gain control signal in order to decrease the gain in response to each comparator event indicated by the comparison signal.

4. The circuit of claim 1, wherein the control circuit is configured to generate the second threshold based on an average value of the gain control signal.

5. The circuit of claim 1, wherein the control circuit is configured to generate the gain control signal in order to increase the gain if the comparison signal indicates no comparator event during a third time duration.

6. The circuit of claim 1, wherein the control circuit is configured to generate the gain control signal in order to bring the amplitude of the amplified electrical signal towards the first threshold level of the comparator.

7. An audio device comprising:
   the circuit of any of claim 1;
   an analog to digital converter configured to receive the electrical signal and generate a digital audio signal based on the electrical signal; and
   a power management circuit configured to selectively activate the analog to digital converter based on the sound activity alert signal.

8. The audio device of claim 7, further comprising a communications interface configured to transmit the digital audio signal to one or more further circuits, wherein the power management circuit is further configured to activate or deactivate at least one of the communications interface and the one or more further circuits based on the sound activity alert signal.

9. The audio device of claim 8, wherein the communications interface is configured to transmit the sound activity alert signal to the one or more further circuits.

10. The audio device of claim 7, further comprising:
    an audio amplifier configured to amplify the electrical signal and provide the amplified electrical signal to the analog to digital converter, wherein the power management circuit is further configured to activate or deactivate the audio amplifier based on the sound activity alert signal.

11. The audio device of claim 7, further comprising:
    an audio processing circuit configured to process the digital audio signal, wherein the power management circuit is further configured to activate or deactivate the audio processing circuit based on the sound activity alert signal.

12. A method of sound activity detection by an activity detection circuit, the method comprising:
    generating, by a transducer, an electrical signal based on detected sound;
    amplifying, by a variable gain amplifier, the electrical signal to generate an amplified electrical signal;
    comparing, by a comparator, the amplified electrical signal with at least one threshold level to generate a comparison signal indicating comparator events; and
    generating, by a control circuit based on the comparison signal, a gain control signal for controlling the gain of the variable gain amplifier, and an sound activity alert signal indicating the detection of sound activity, wherein the control circuit is adapted to assert the sound activity alert signal if the gain control signal remains below a second threshold for more than a second time duration.

13. The method of claim 12, wherein generating the gain control signal comprises decreasing the gain if the comparison signal indicates a comparator event having a duration greater than a first time duration.

* * * * *